United States Patent
De Santis (10) Patent No.: US 11,640,397 B2
(45) Date of Patent: *May 2, 2023

(54) ACCELERATION OF DATA QUERIES IN MEMORY

(71) Applicant: Micron Technology, Inc., Boise, ID (US)

(72) Inventor: Luca De Santis, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 179 days.

This patent is subject to a terminal disclaimer.

(21) Appl. No.: 17/033,332

(22) Filed: Sep. 25, 2020

(65) Prior Publication Data

US 2022/0100760 A1 Mar. 31, 2022

(51) Int. Cl.
| | |
|---|---|
| *G06F 16/2453* | (2019.01) |
| *G06F 16/2455* | (2019.01) |
| *G06F 16/22* | (2019.01) |
| *G06F 11/10* | (2006.01) |
| *G06F 12/02* | (2006.01) |
| *G06F 12/0882* | (2016.01) |
| *G06F 16/248* | (2019.01) |
| *G11C 8/12* | (2006.01) |
| *G11C 7/10* | (2006.01) |

(52) U.S. Cl.
CPC .... *G06F 16/24539* (2019.01); *G06F 11/1044* (2013.01); *G06F 11/1068* (2013.01); *G06F 12/0238* (2013.01); *G06F 12/0882* (2013.01); *G06F 16/2282* (2019.01); *G06F 16/248* (2019.01); *G06F 16/24532* (2019.01); *G06F 16/24552* (2019.01); *G11C 7/1006* (2013.01); *G11C 8/12* (2013.01)

(58) Field of Classification Search
CPC .......... G06F 16/24539; G06F 16/2282; G06F 16/248; G06F 11/1044; G06F 11/1068; G06F 12/0238; G06F 12/0882; G11C 7/1006; G11C 8/12
USPC ................................................... 365/185.05
See application file for complete search history.

(56) References Cited

U.S. PATENT DOCUMENTS

| | | | |
|---|---|---|---|
| 4,110,832 A | 8/1978 | Hubble et al. | |
| 9,105,330 B1 | 8/2015 | Eldredge et al. | |
| 9,343,155 B1 | 5/2016 | De Santis et al. | |
| 9,355,026 B1 | 5/2016 | Eldredge et al. | |
| 9,430,735 B1 | 8/2016 | Vali et al. | |
| 11,289,166 B2 * | 3/2022 | Helm ..................... | G11C 16/24 |
| 2015/0016172 A1 * | 1/2015 | Loh ........................ | G06F 3/0608 |
| | | | 365/51 |
| 2016/0284402 A1 * | 9/2016 | Kanai ................. | G11C 13/0069 |

(Continued)

OTHER PUBLICATIONS

U.S. Appl. No. 13/796,189, entitled "Performing Complex Arithmetic Functions in a Memory Device", filed Mar. 12, 2013, (23 pgs.).

*Primary Examiner* — Huan Hoang (74) *Attorney, Agent, or Firm* — Brooks, Cameron & Huebsch, PLLC (57) ABSTRACT

The present disclosure includes apparatuses and methods for acceleration of data queries in memory. A number of embodiments include an array of memory cells, and processing circuitry configured to receive, from a host, a query for particular data stored in the array, execute the query, and send only the particular data to the host upon executing the query.

24 Claims, 8 Drawing Sheets

(56) References Cited

U.S. PATENT DOCUMENTS

2017/0068464 A1* 3/2017 Crawford, Jr. ........ G06F 3/0653
2018/0108397 A1* 4/2018 Venkata .............. G11C 11/4093

* cited by examiner

| Prog # | Age | Seniority | ID | Dept |
|--------|-----|-----------|--------|---------|
| 0 | 45 | 15 | John | Eng |
| 1 | 34 | 7 | Serena | Finance |
| 2 | 65 | 30 | William | R&D |

| Prog # | Age | Seniority | ID | ID | ID | ID | Dept | Dept |
|--------|-----|-----------|-----|-----|-----|-----|------|------|
| 209 | 211 | 216 | 217 | 218 | 219 | 221 | 223 | 228 |

| | | | | | | | |
|---|---|---|---|---|---|---|---|
| A | | | 0 | 1 | 1 | 1 | 1 | 0 |

| | | | | | | | | |
|---|---|---|---|---|---|---|---|---|
| A | | | 0 | 1 | 1 | 1 | 1 | 0 |
| B | | | 1 | 1 | 0 | 1 | 0 | 1 |
| S | | | 1 | 0 | 1 | 0 | 1 | 1 |
| C | | | 0 | 1 | 0 | 1 | 0 | 0 |

437, 438, 439, 441

| | | | | | | | | |
|---|---|---|---|---|---|---|---|---|
| S | | | 1 | 0 | 1 | 0 | 1 | 1 |
| C | | 0 | 1 | 0 | 1 | 0 | 0 | 0 |

439, 443, 445

| | | | | | | | | |
|---|---|---|---|---|---|---|---|---|
| S | | | 0 | 0 | 0 | 0 | 1 | 1 |
| C | | 0 | 1 | 0 | 1 | 0 | 0 | 0 |

447

| | | | | | | | | |
|---|---|---|---|---|---|---|---|---|
| S | | | 0 | 0 | 0 | 0 | 1 | 1 |
| C | 0 | 1 | 0 | 1 | 0 | 0 | 0 | 0 |

449

| | | | | | | | | |
|---|---|---|---|---|---|---|---|---|
| S | | 1 | 0 | 1 | 0 | 0 | 1 | 1 |
| C | | 0 | 0 | 0 | 0 | 0 | 0 | 0 |

| | | | | | | | |
|---|---|---|---|---|---|---|---|
| A |   |   | 1 | 1 | 0 | 1 | 0 | 1 | ~537
| B |   |   | 0 | 1 | 1 | 1 | 1 | 0 | ~538
| Sub |   |   | 1 | 0 | 1 | 0 | 1 | 1 | ~539
| Bor |   |   | 0 | 0 | 1 | 0 | 1 | 0 | ~541

| | | | | | | | |
|---|---|---|---|---|---|---|---|
| Sub |   |   | 1 | 0 | 1 | 0 | 1 | 1 | ~539
| Bor |   | 0 | 0 | 1 | 0 | 1 | 0 | 0 | ~543

~545

| | | | | | | | |
|---|---|---|---|---|---|---|---|
| Sub |   |   | 1 | 1 | 1 | 1 | 1 | 1 | 
| Bor |   |   | 0 | 1 | 0 | 1 | 0 | 0 |

}547

| | | | | | | | |
|---|---|---|---|---|---|---|---|
| Sub |   |   | 1 | 1 | 1 | 1 | 1 | 1 |
| Bor |   | 0 | 1 | 0 | 1 | 0 | 0 | 0 |

}549

| | | | | | | | |
|---|---|---|---|---|---|---|---|
| Sub |   |   | 0 | 1 | 0 | 1 | 1 | 1 |
| Bor |   |   | 0 | 0 | 0 | 0 | 0 | 0 |

| | | | | 1 | 0 | 1 | 1 | 1 | — 637 A |
|---|---|---|---|---|---|---|---|---|---|
| | | | | | | 1 | 1 | 1 | — 638 B |
| | | | | 1 | 0 | 1 | 1 | 1 | — 639 prod$_1$ |
| | | | | 1 | 0 | 1 | 1 | 1 | — 641 prod$_2$ |

| | | | | 1 | 0 | 1 | 1 | 1 | — 639 prod$_1$ |
|---|---|---|---|---|---|---|---|---|---|
| | | | 1 | 0 | 1 | 1 | 1 | 0 | — 643 prod$_2$ |

645

| | 1 | 0 | 0 | 0 | 1 | 0 | 1 | } 647 |
|---|---|---|---|---|---|---|---|---|
| | | | 1 | 0 | 1 | 1 | 1 | |

| | 1 | 0 | 0 | 0 | 1 | 0 | 1 | } 649 |
|---|---|---|---|---|---|---|---|---|
| | | 1 | 0 | 1 | 1 | 1 | 0 | |

| 1 | 0 | 1 | 0 | 0 | 0 | 0 | 1 | } 651 |
|---|---|---|---|---|---|---|---|---|
| | 0 | 0 | 0 | 0 | 0 | 0 | 0 | |

ACCELERATION OF DATA QUERIES IN MEMORY

TECHNICAL FIELD

The present disclosure relates generally to semiconductor memory apparatuses and methods, and more particularly, to apparatuses and methods for acceleration of data queries in memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing an operation on data (e.g., one or more operands). As used herein, an operation can be, for example, a Boolean operation, such as AND, OR, NOT, NAND, NOR, and XOR, and/or other operations (e.g., invert, shift, arithmetic, statistics, among many other possible operations). For example, functional unit circuitry (FUC) may be used to perform arithmetic operations such as addition, subtraction, multiplication, and/or division on operands via a number of logical operations.

A number of components in an electronic system may be involved in providing instructions to the FUC for execution. The instructions may be generated, for instance, by a processing resource such as a controller and/or host processor. Data (e.g., the operands on which the instructions will be executed) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the operations and/or data may also be sequenced and/or buffered. A sequence to complete an operation in one or more clock cycles may be referred to as an operation cycle. Time consumed to complete an operation cycle costs in terms of processing and computing performance and power consumption, of a computing apparatus and/or system.

In many instances, the processing resources (e.g., processor and/or associated FUC) may be external to the memory array, and data can be accessed via a bus between the processing resources and the memory array to execute a set of instructions. Processing performance may be improved in a processor-in-memory (PIM) device, in which a processor may be implemented internally and/or near to a memory (e.g., directly on a same chip as the memory array), which may conserve time and power in processing. A PIM device may save time and/or power by reducing and/or eliminating external communications.

DETAILED DESCRIPTION

The present disclosure includes apparatuses and methods for acceleration of data queries in memory. A number of embodiments include an array of memory cells, and processing circuitry configured to receive, from a host, a query for particular data stored in the array, execute the query, and send only the particular data to the host upon executing the query.

Memory, such as, for instance, NAND flash memory, can be used as a database in a computing system. In some previous approaches, the coordination of queries (e.g., searches) for data stored in the memory (e.g., in the database) can be controlled by circuitry external to the memory. For example, in some previous approaches, when a user of a host computing device coupled to the memory issues a query for some particular data stored in the memory, data (e.g., pages of data) stored in the memory is transferred from the memory to the host, and the host then processes the received data to identify any data included therein that matches the query (e.g., that satisfies the parameters of the query). For instance, the host may perform operations, such as, for instance, arithmetic operations, on the data to identify the data from the memory that matches the query.

Controlling data queries via circuitry external to the memory in such a manner, however, may be inefficient due to the amount of time (e.g., delay) associated with transferring (e.g., sending) all the data from the memory to the external circuitry (e.g., host) for processing. This delay may be further exacerbated by bandwidth bottlenecks that may occur between the memory and the host.

In contrast, embodiments of the present disclosure can utilize control circuitry that is resident on (e.g., physically located on or tightly coupled to) the memory to process a data query issued by the host (e.g., to identify the data stored in the memory that matches the query). For instance, embodiments of the present disclosure can utilize processor-in-memory (PIM) capabilities to perform the operations (e.g., arithmetic operations) needed to identify the data that matches the query, such that only the data in the memory that matches the query is sent to the host (e.g., rather than having to send all the data from the memory to the host for processing).

Accordingly, embodiments of the present disclosure can accelerate (e.g., increase the speed of) data queries as compared to previous approaches (e.g., approaches in which the queries are controlled via external circuitry). Additionally, embodiments of the present disclosure can perform the operations of the data query on multiple portions of the data stored in the memory in parallel, which can further accelerate the query.

As used herein, the designator "N", particularly with respect to reference numerals in the drawings, indicates that a number of the particular feature so designated can be included with a number of embodiments of the present disclosure. Additionally, as used herein, "a", "an", or "a number of" something can refer to one or more of such things, and "a plurality of" something can refer to two or more such things. For example, a number of memory cells can refer to one or more memory cells, and a plurality of memory cells can refer to two or more memory cells.

The figures herein follow a numbering convention in which the first digit or digits correspond to the drawing figure number and the remaining digits identify an element or component in the drawing. Similar elements or components between different figures may be identified by the use of similar digits. For example, 408 may reference element "08" in FIG. 2B, and a similar element may be referenced as 508 in FIG. 3.

Figure 1:
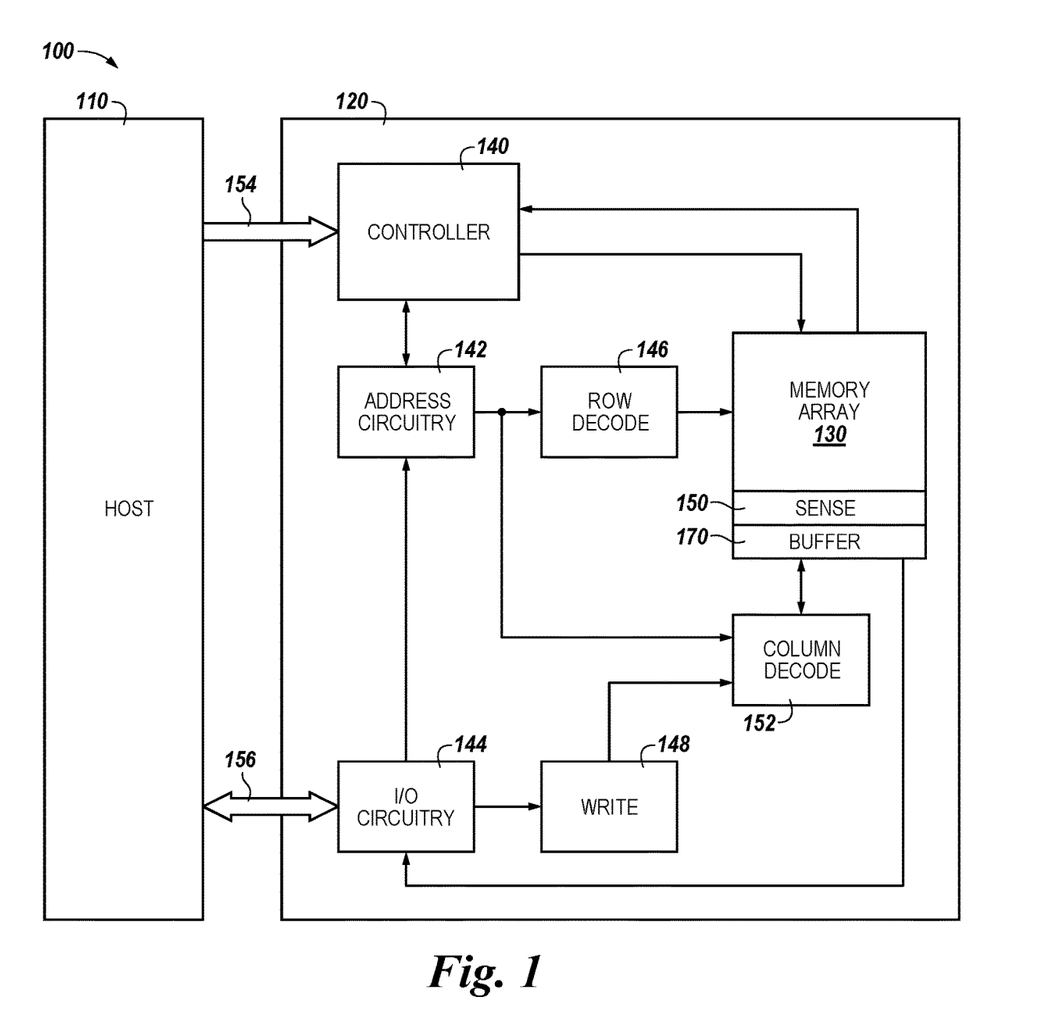
FIG. 1 is a block diagram of an apparatus in the form of a computing system including a memory device in accordance with a number of embodiments of the present disclosure.

FIG. 1 is a block diagram of an apparatus in the form of a computing system 100 including a memory device 120 in accordance with a number of embodiments of the present disclosure. As used herein, a memory device 120, a memory array 130, a controller 140, sensing circuitry 150, and/or a buffer 170 might also be separately considered an "apparatus." Further, controller 140, sensing circuitry 150, and buffer 170 can comprise processing circuitry of memory device 120. That is, "processing circuitry", as used herein, can refer to and/or include controller 140, sensing circuitry 150, and/or buffer 170.

In the example illustrated in FIG. 1, system 100 includes a host 110 coupled (e.g. connected) to memory device 120, which includes a memory array 130. Host 110 can be a host system such as a personal laptop computer, a desktop computer, a digital camera, a mobile (e.g., smart) phone, a memory card reader, and/or an internet-of-things (IoT) enabled device, among various other types of hosts. Host 110 can include a system motherboard and/or backplane and can include a number of processing resources, one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a von Neumann architecture, embodiments of the present disclosure can be implemented in non-von Neumann architectures, which may not include one or more components (e.g., CPU, ALU, etc.) often associated with a von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines (which may be referred to herein as digit lines or data lines). Although a single array 130 is shown in FIG. 1, embodiments are not so limited. For instance, memory device 120 may include a number of arrays 130.

In a number of embodiments, memory array 130 can comprise (e.g., be part of and/or used as) a database, such as, for instance, an employee database in which data (e.g., information) about employees is stored. For example, memory array 130 can include a plurality of pages of memory cells that store the data of the database (e.g., the data of the database can be arranged in pages). Each respective page can store a number of data records of the database, with each respective record including a number of data fields. The amount of data included in each respective field (e.g. the data structure of the records) can be defined by host 110 (e.g., by a user of the host). An example of such a database, and a representation of how the data can be stored in such a database, will be further described herein (e.g., in connection with FIGS. 2A-2B).

The memory device 120 includes address circuitry 142 to latch address signals provided over a combined data/address bus 156 (e.g., an external input/output bus connected to the host 110) by input/output (I/O) circuitry 144, which can comprise an internal I/O bus. Address signals are received through address circuitry 142 and decoded by a row decoder 146 and a column decoder 152 to access the memory array 130. Data can be sensed (e.g., read) from memory array 130 by sensing voltage and/or current changes on the data lines using a number of sense amplifiers, as described herein, of the sensing circuitry 150. The sensing circuitry 150 (e.g., a sense amplifier of sensing circuitry 150) can read and latch a page (e.g., row) of data from the memory array 130. A buffer (e.g., page buffer) 170 can be coupled to the sensing circuitry 150, and can be used in combination with sensing circuitry 150 to sense, store (e.g., cache and/or buffer), perform compute functions (e.g., operations), and/or move data, as will be further described herein. The I/O circuitry 144 can be used for bi-directional data communication with host 110 over the I/O bus 156. The write circuitry 148 can be used to program (e.g., write) data to the memory array 130.

Control circuitry (e.g., controller) 140 decodes signals provided by control bus 154 from the host 110. These signals can include chip enable signals, write enable signals, and/or address latch signals that are used to control operations performed on the memory array 130, including data read, data write, data store, data movement (e.g., copying, transferring, and/or transporting data values), and/or data erase operations. In various embodiments, the control circuitry 140 is responsible for executing instructions from the host 110 and accessing the memory array 130. The control circuitry 140 can be a state machine, a sequencer, or some other type of controller.

In a number of embodiments, the sensing circuitry 150 can include a number of latches that can be used to store temporary data. In a number of embodiments, the sensing circuitry 150 and buffer 170 (e.g., the latches included in sensing circuitry 150) can be used to perform operations, such as operations associated with data queries received from host 110 as will be further described herein, using data stored in array 130 as inputs, without performing (e.g., transferring data via) a sense line address access (e.g., without firing a column decode signal). As such, various operations, such as those associated with data queries received from host 110 as will be further described herein, can be performed using, and within, sensing circuitry 150 and buffer 170 rather than (or in association with) being performed by processing resources external to the sensing circuitry 150 (e.g., by a processor associated with host 110 and/or other processing circuitry, such as ALU circuitry, located on device 120 (e.g., on control circuitry 140 or elsewhere)).

In various previous approaches, when a query is issued for some particular data stored in memory array 130, data would be read from the memory via sensing circuitry and provided to external ALU circuitry via I/O lines (e.g., via local and/or global I/O lines) and/or an external data bus. The external ALU circuitry could include a number of registers, and would perform operations (e.g., arithmetic operations) on the data to identify data included in the read data that matches the query. In contrast, in a number of embodiments of the present disclosure, sensing circuitry 150 and buffer 170 are configured to perform such operations on data stored in memory cells in memory array 130, without transferring the data via (e.g., enabling) an I/O line (e.g., a local I/O line) coupled to the sensing circuitry and buffer, which can be formed on the same chip as the array and/or on pitch with the memory cells of the array. Enabling an I/O line can include enabling (e.g., turning on, activating) a transistor having a gate coupled to a decode signal (e.g., a column decode signal) and a source/drain coupled to the I/O line. Embodiments are not so limited. For instance, in a number of embodiments, the sensing circuitry and buffer can be used to perform operations without enabling column decode lines of the array.

In various embodiments, methods and apparatuses are provided which can function as a PIM. As used herein, "PIM" refers to memory in which operations may be performed without transferring the data on which the operations are to be performed to an external location such as a host processor via an external bus (e.g., bus 156).

As such, in a number of embodiments, circuitry (e.g., registers and/or an ALU) external to array 130, sensing circuitry 150, and buffer 170 may not be needed to perform operations, such as arithmetic operations associated with data queries received from host 110 as will be further described herein, as the sensing circuitry 150 and buffer 170 can be controlled to perform the appropriate operations associated with such compute functions without the use of an external processing resource. Therefore, the sensing circuitry 150 and buffer 170 may be used to complement and/or to replace, at least to some extent, an external processing resource (or at least the bandwidth of such an external processing resource) such as host 110. However, in a number of embodiments, the sensing circuitry 150 and buffer 170 may be used to perform operations (e.g., to execute instructions) in addition to operations performed by an external processing resource (e.g., host 110). For instance, host 110 and/or sensing circuitry 150 may be limited to performing only certain operations and/or a certain number of logical operations.

As an example, memory device 120 can receive, from host 110, a query for some particular data stored in memory array 130. For example, the query can comprise a command to search for any data stored in array 130, such as, for instance, any data stored in a particular (e.g., specific) one of the number of data fields of each respective data record stored in array 130, that satisfies a particular parameter(s). The query can be issued by a user of host 110, which can send the query to memory device 120. An example of such a query will be further described herein (e.g., in connection with FIG. 3).

Upon memory device 120 receiving the query from host 110, sensing circuitry 150 and buffer 170 (which, for simplicity, may be collectively referred to herein as sensing circuitry 150) can execute (e.g., run) the query by searching for (e.g., locating and retrieving) the particular data in memory array 130. For example, sensing circuitry 150 can identify any data stored in array 130 that matches the query (e.g., that satisfies the parameters of the query). Further, the query can be executed on multiple pages of data stored in array 130. For instance, sensing circuitry 150 can execute the query on each of the pages of data stored in array 130 in parallel (e.g., concurrently), to identify whether the data stored in the particular one of the number of data fields in each respective data record stored in array 130 matches the query in parallel. For example, in some instances, one page of data may store more data records than the other pages, which can be a source of high parallelism. Further, in examples in which memory device 120 includes a plurality of memory arrays, sensing circuitry 150 can execute the query on each of the arrays in parallel (e.g., the same query can be executed in parallel on each of the arrays).

As an example, sensing circuitry 150 can execute the query (e.g., identify the data stored in memory array 130 that matches the query) by performing an arithmetic operation (e.g., function) on the data stored in array 130. Performing the arithmetic operation on the data can comprise, for example, determining whether a quantity represented by the data is less than a particular quantity, or determining whether a quantity represented by the data is greater than a particular quantity, among other arithmetic operations.

As an example, sensing circuitry 150 can identify the data stored in memory array 130 that matches the query by sensing (e.g., reading) the data stored in the array and storing the sensed data in page buffer 170, creating (e.g., building) a mask for the sensed data in page buffer 170 on which the arithmetic operation is to be performed, creating (e.g. building) an operand for the arithmetic operation, applying an operator of the arithmetic operation to the operand and the sensed data in page buffer 170 for which the mask was created, and nullifying the sensed data that is determined to be invalid (e.g., and thus does not match the query) upon applying the operator of the arithmetic operation, such that only the sensed data that matches the query is available on page buffer 170. An example of such a process for identifying the data that matches the query will be further described herein (e.g., in connection with FIG. 3).

Sensing circuitry 150 can perform the arithmetic operation on multiple portions of the data (e.g., on each respective data record) in array 130 in parallel. For instance, combining the page buffer 170 with the operation of sensing circuitry 150, and implementing a left/right shift operation for page buffer 170, allows memory device 120 to be used as a single instruction multiple data (SMID) device. As such, sensing circuitry 150 can perform the same arithmetic operation on a large amount of data in parallel. Examples of such complex arithmetic functions that can be performed using a left/right shift operation will be further described herein (e.g., in connection with FIGS. 4-6).

Controller 140 can have error correction code (ECC) capabilities. For example, controller 140 can perform an ECC operation on the sensed data stored in page buffer 170 (e.g., before the arithmetic operation is performed on the sensed data), and sensing circuitry 150 can then perform the arithmetic operation on the sensed data after the ECC operation is performed (e.g., such that any errors in the sensed data are corrected before the arithmetic operation is performed)

Upon sensing circuitry 150 executing the query (e.g., identifying the data stored in memory array 130 that matches the query), sensing circuitry 150 (e.g., memory device 120) can send (e.g., output) only that identified data to host 110. That is, only the particular (e.g., specific) data for which the query was issued is sent to host, with no data stored in array 130 that does not match the query being sent to host 110. For instance, only the sensed data in buffer 170 that is determined to be valid upon the operator of the arithmetic operation being applied thereto (e.g., only the sensed data in buffer 170 that is not nullified) is sent to host 110.

In a number of embodiments, sensing circuitry 150 can execute the query in parallel with a subsequent (e.g., the next) sense operation. For instance, memory device 120 can receive, from host 110, a command to sense (e.g., read) data stored in memory array 130 (e.g., the data stored in a particular page of the array), and sense circuitry 150 can execute the sense command in parallel with executing the query.

Figure 2A:
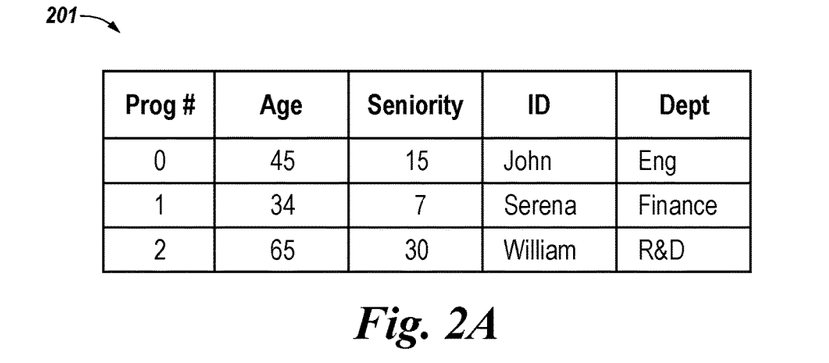
FIG. 2A is a table illustrating an example of data that can be stored in a database in accordance with a number of embodiments of the present disclosure.
Figure 2B:
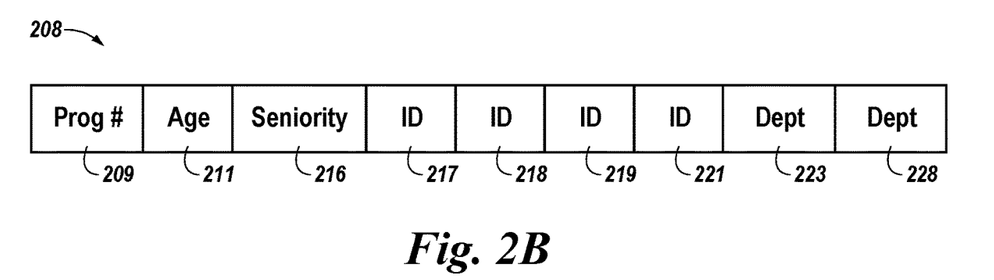
FIG. 2B is a representation of an example record in which the data of the table illustrated in FIG. 2A can be stored in a database in accordance with a number of embodiments of the present disclosure.

FIG. 2A is a table 201 illustrating an example of data that can be stored in a database in accordance with a number of embodiments of the present disclosure. FIG. 2B is a representation of an example record 208 in which the data of table 201 can be stored in the database in accordance with a number of embodiments of the present disclosure. The database can be included in and/or comprise memory array 130 previously described in connection with FIG. 1, for example.

The database can be, for example, an employee database in which data (e.g., information) about employees is stored. For instance, in the example illustrated in FIG. 2A, the database may store data about three employees (e.g., John, Serena, and William). The data stored in the database may include, for instance, a programming number assigned to each of the employees (e.g., 0 for John, 1 for Serena, and 2 for William), the age of each employee (e.g., 45 for John, 34 for Serena, and 65 for William), the seniority (e.g., number of years with the company) of each employee (e.g., 15 for John, 7 for Serena, and 30 for William) identification for (e.g., the name of) each employee, and the department of the employee (e.g., engineering for John, finance for Serena, and research and development for William), as illustrated in FIG. 2A. Embodiments of the present disclosure, however, are not limited to a particular number of employees, particular types of data that can be stored in the database, or a particular type of database.

The data about each respective employee illustrated in table 201 in FIG. 2A can be included in a different respective record that can be stored in the database. An example representation of such a data record 208 is illustrated in FIG. 2B.

As shown in FIG. 2B, data record 208 can include a number of data fields 209, 211, 216, 217, 218, 219, 221, 223, and 228. Each respective data field of record 208 can store data corresponding to (e.g., representing) the data about one of the employees illustrated in table 201. For instance, in the example illustrated in FIG. 2B, data field 209 can store data corresponding to the assigned programming number for that employee, data field 211 can store data corresponding to the age of that employee, data field 216 can store data corresponding to the seniority of that employee, data fields 217, 218, 219, and 221 can store data corresponding to identification for that employee, and data fields 223 and 228 can store data corresponding to the department of that employee.

In the example illustrated in FIG. 2B, data field 209 (e.g., the data corresponding to the assigned programming number for the employee) can comprise 1 Byte of data, data field 211 (e.g., the data corresponding to the age of the employee) can comprise 1 Byte of data, and data field 216 (e.g., the data corresponding to the seniority of the employee) can comprise 1 Byte of data. Further, data fields 217, 218, 219, and 221 (e.g., the data corresponding to the identification for the employee) can together comprise 16 Bytes of data. For instance, each respective data field 217, 218, 219, and 221 can comprise 4 Bytes of data. Further, data fields 223 and 228 (e.g., the data corresponding to the department of the employee) can together comprise 4 Bytes of data. For instance, each respective data field 223 and 228 can comprise 2 Bytes of data.

The amount of data included in each respective field (e.g., the data structure of record 208) can be defined, for instance, by commands issued by a host (e.g., by a user of the host), such as host 110 previously described in connection with FIG. 1. For instance, in the example illustrated in 2B, the user of the host would define the data structure for record 208 as 1-1-1-4-2. However, embodiments of the present disclosure are not limited to a particular data structure for record 208.

As previously described herein (e.g., in connection with FIG. 1), the data of the database can be arranged in pages, and each respective page can store multiple data records. In a number of embodiments, the boundary for each respective data record stored in a page can be the data field of that record that stores the data corresponding to the assigned programming number for the employee of that record. For instance, the boundary for data record 208 would be data field 209. The data record boundaries, however, are not necessarily aligned with any particular (e.g., specific) page's byte position in the database.

Figure 3:
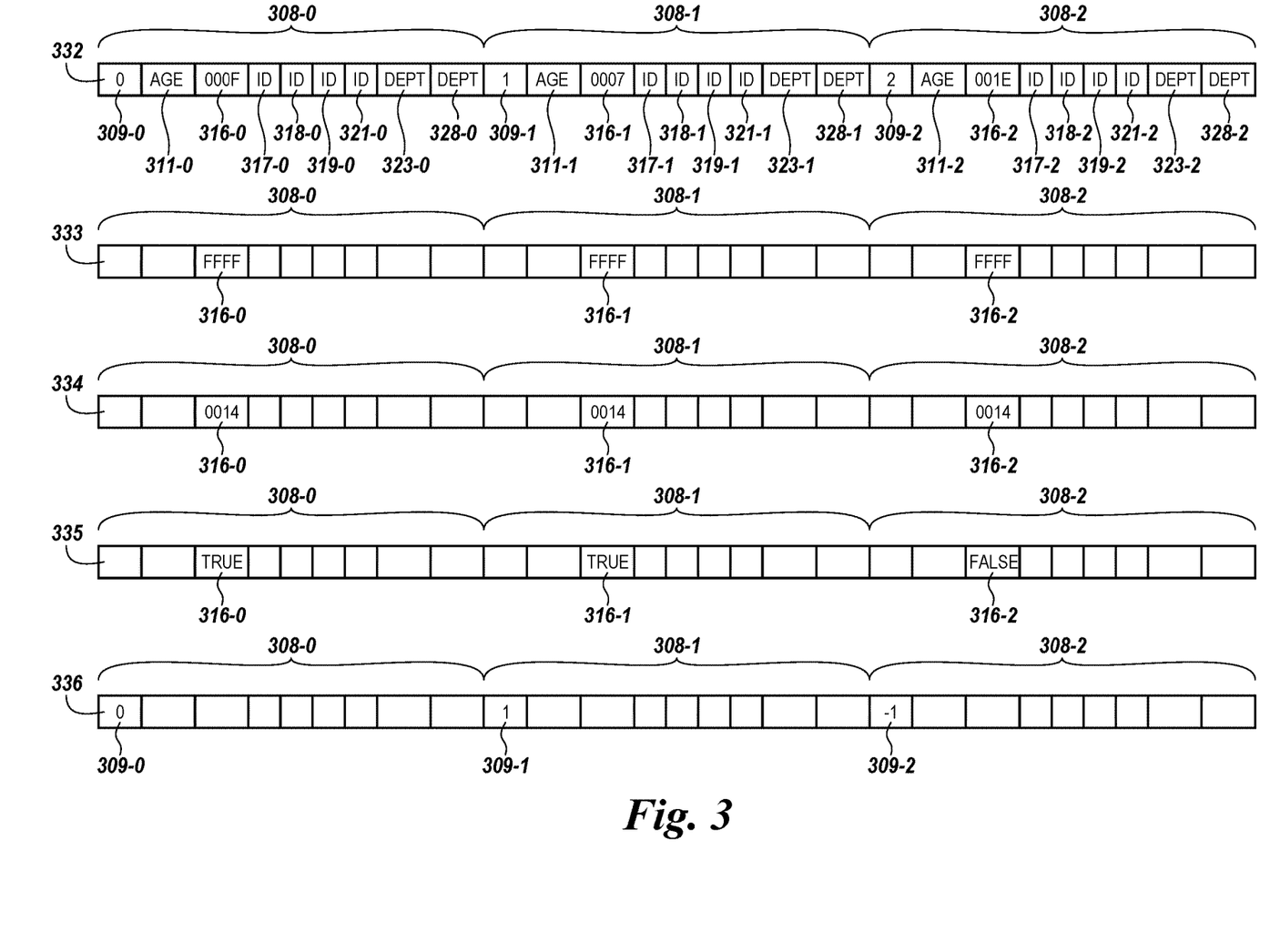
FIG. 3 is a representation of a process for executing a data query in accordance with a number of embodiments of the present disclosure.

FIG. 3 is a representation of a process for executing a data query (e.g., identifying data stored in a database that matches the query) in accordance with a number of embodiments of the present disclosure. The query can be executed, for instance, by sensing circuitry 150 and/or buffer 170 of memory device 120 previously described in connection with FIG. 1. The database can be, for example, an employee database in which data about employees, such as, for instance, the data illustrated in table 201 previously described in connection with FIG. 2A, is stored, and the data about each respective employee can be included in a different respective record, such as, for instance, data record 208 previously described in connection with FIG. 2B, stored in the database. Further, the data structure of the data records can be defined by user-issued commands, as previously described in connection with FIG. 2B, such that the internal controller of the memory device (e.g., controller 140 previously described in connection with FIG. 1) is aware of the data structure.

The data query may be received from (e.g., issued by) a host (e.g., a user of the host), such as host 110 previously described in connection with FIG. 1. In the example illustrated in FIG. 3, the user of the host would like to issue a query for all employees with a seniority of less than 20 years. Since it is the third data field (e.g., field 316) in the data record for each employee that corresponds to that employee's seniority, the query would comprise a command to search for data stored in the third data field of each respective record that satisfies the parameter of being less than 20, such as, for instance, "search(3,'<',20)".

In response to receiving the data query, sensing circuitry 150 can sense (e.g., read) each data record stored in the employee database, and store the sensed data records in buffer 170. For example, at element 332 of FIG. 3, data records 308-0, 308-1, and 308-2 for employees John, Serena, and William, respectively, are each sensed from the database and stored in the buffer.

As shown at element 332 of FIG. 3, each respective data record 308-0, 308-1, 308-2 includes data fields 309, 311, 316, 317, 318, 319, 321, 353, and 328 (e.g., data record 308-0 includes fields 309-0, 311-0, 316-0, etc., data record 308-1 includes fields 309-1, 311-1, 316-1, etc., and data record 308-2 includes fields 309-2, 311-2, 316-2, etc.), in a manner analogous to data record 208. For example, data field 309-0 of record 308-0 stores data corresponding to the assigned programming number of 0 for John, data field 316-0 of record 308-0 stores data, in hexadecimal form (e.g., 000F), corresponding to the seniority of 15 years for John, data field 309-1 of record 308-1 stores data corresponding to the assigned programming number of 1 for Serena, data field 316-1 of record 308-1 stores data, in hexadecimal form (e.g., 0007), corresponding to the seniority of 7 years for Serena, data field 309-2 of record 308-2 stores data corresponding to the assigned programming number of 2 for William, and data field 316-2 of record 308-2 stores data, in hexadecimal form (e.g., 001E), corresponding to the seniority of 30 years for William, as illustrated in FIG. 3.

At element 333 of FIG. 3, a mask is created (e.g., built) for data fields 316-0, 316-1, and 316-2 of records 308-0, 308-1, and 308-2 in the page buffer, respectively, since it is the data stored in these fields that will be checked for this query. That is, the mask is created according to the data structure for the records that has been defined by the user. The mask can be created in hexadecimal form (e.g., FFFF), as illustrated in FIG. 3.

At element 334 of FIG. 3, an operand (e.g., the second operand) is created (e.g., built) for an arithmetic operation that can be used determine whether the data stored in fields 316-0, 316-1, and 316-2 matches the query, and the operand is put on these data fields in the page buffer. Since the parameter to be satisfied for the query is whether the data stored in these fields is less than 20, the operand for the arithmetic operation of the query would be 20, in hexadecimal form (e.g., 0014), as illustrated in FIG. 3.

At element 335 of FIG. 3, the operator of the arithmetic operation is applied to the operand and the data stored in fields 316-0, 316-1, and 316-2 to determine whether the data stored in each of these respective fields is valid (e.g., matches the query). Since the parameter to be satisfied for the query is whether the data stored in these fields is less than 20, the operator of the arithmetic operation would be <, and applying the operator would comprise determining whether the data stored in each respective field 316-0, 316-1, and 316-2 is less than 20. Accordingly, the data stored in fields 316-0 and 316-1 would be determined to valid (e.g., true), and the data stored in field 316-2 would be determined to be invalid (e.g., false), as illustrated in FIG. 3.

At element 336 of FIG. 3, any data fields that are determined to be invalid (e.g., and thus do not match the query) are nullified. Invalid data fields can be nullified by, for example, changing the first data field (e.g., field 309) of the data record for that employee to −1. For instance, data field 309-2 (e.g., the assigned programming number for William) would be changed to −1, while data fields 309-0 and 309-1 (e.g., the assigned programming numbers for John and Serena, respectively), would not change, as illustrated in FIG. 3. After the invalid data fields have been nullified, only valid data fields would remain on the page buffer and be sent to the host, as previously described herein (e.g., in connection with FIG. 1).

Figure 4:
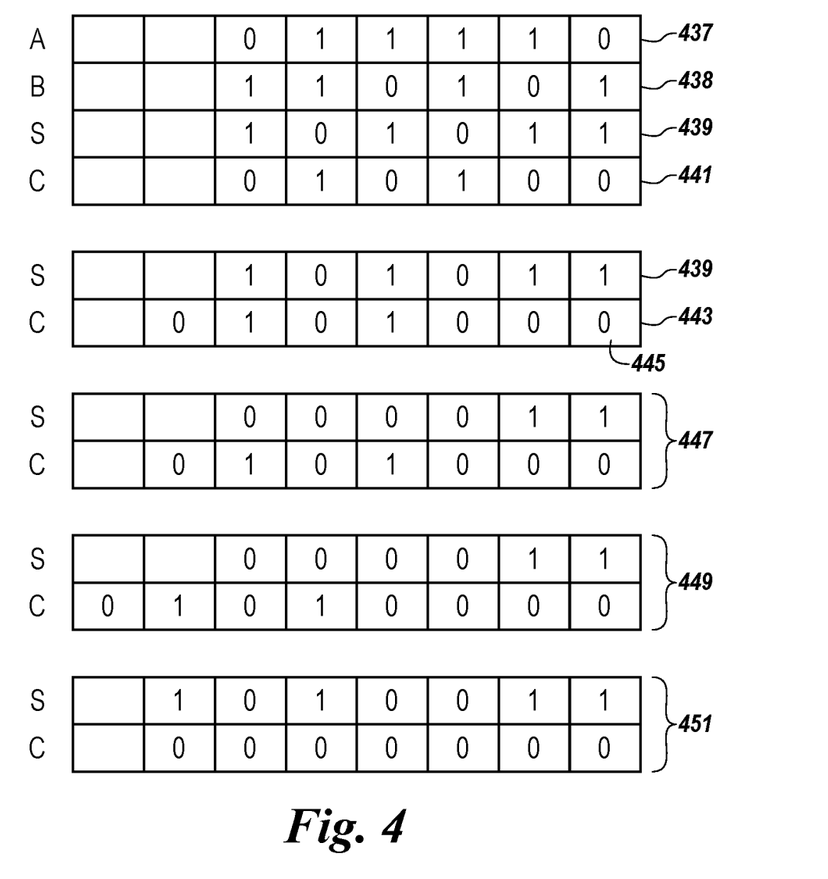
FIG. 4 is a diagram of a method and registers in accordance with a number of embodiments of the present disclosure.
Figure 5:
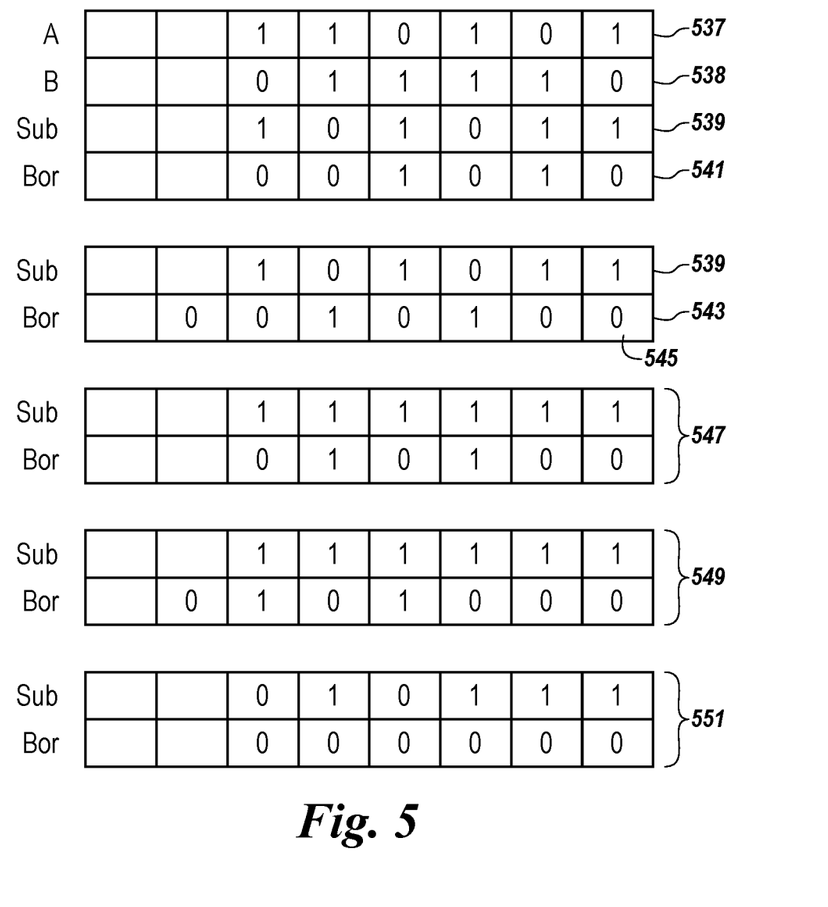
FIG. 5 is a diagram of a method and registers in accordance with a number of embodiments of the present disclosure.
Figure 6:
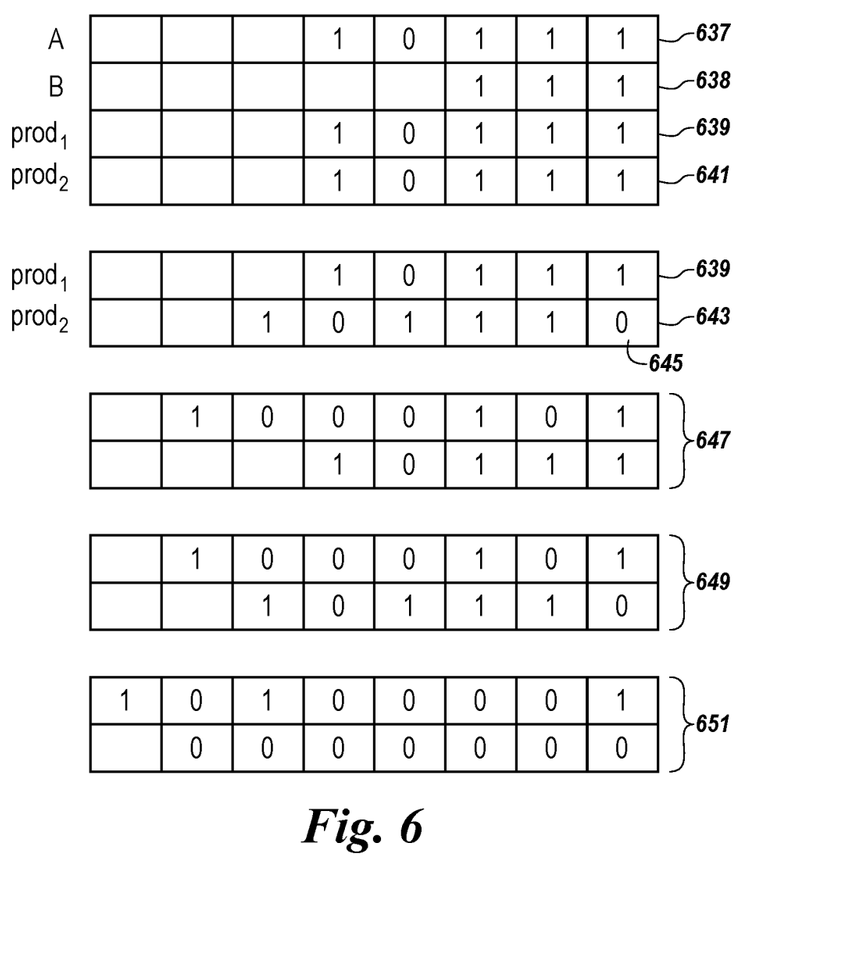
FIG. 6 is a diagram of a method and registers in accordance with a number of embodiments of the present disclosure.

FIGS. 4-6 are diagrams of methods and registers in accordance with a number of embodiments of the present disclosure. The methods and registers illustrated in FIGS. 4-6 can be used to perform complex arithmetic operations (e.g., functions), such as sum and subtraction, using left/right shift operations, such that the same arithmetic operation can be performed on a large amount of data, such as, for instance, multiple data records of memory array 130, in parallel. Further, such complex operations (e.g., sum and subtraction) can be utilized to execute the complex database queries described herein. For instance, a subtraction operation utilizing such shift operations can be used to apply the greater than (>) and less than (<) operators used to execute the complex queries described herein.

Referring to FIG. 4, an example of a complex sum function is shown. A pair of words A (in register 437) and B (in register 438) are to be added. A and B registers 439 and 441, which in one embodiment may be page buffer registers, are used respectively as a sum register (A register) and a carry register (B register). The sum of individual binary digits in word A and word B is written to the respective sum register 439 entry, and a carry binary digit, if any, is written to the carry register 441. For example, adding word A 011110 to word B 110101 results in a base sum of 101011 and a carry result of 010100. Once the base sum and carry result are stored in the sum and carry registers, respectively, the carry result is shifted to the left as shown at 443, resulting in the carry register containing 0101000, with an extra 0 added to replace the shifted 0 from register entry 445. The sum (101011) and the shifted carry result (0101000) are again summed, resulting in a sum of 000011 and a carry result of 0101000 (447). This can be accomplished in one embodiment by loading the sum and shifted carry results into registers 437 and 438, and performing the operation. In another embodiment, a second set of sum and carry registers may be used. It should be understood that whatever registers are used, the operation is the same, and the embodiments of the disclosure are amenable to use with four registers, or more. The carry result is again shifted left, resulting in 01010000, and the sum of 000011 and shifted carry result 01010000 are added (449), resulting in a sum of 1010011 and a carry result of 0000000 (451). When the carry register is all 0 entries, the sum of words A and B is complete. That is, 011110+110101=1010011. This complex function can be performed with the basic logic operation present in sensing circuitry 150, page buffer 170, and a left/right shift operation.

Referring to FIG. 5, an example of a complex subtraction function is shown. The binary word B (in register 538) is subtracted digit by digit from word A (in register 537), the base subtraction result being stored in register 539, and any borrow result stored in a borrow register 541. That is, if a borrow is to be made, the specific binary digit of the borrow register is written with a logic 1. Then, when the subtraction base result is in register 539, and the borrow result is in register 541, the borrow result is shifted to the left, and the shifted borrow result is subtracted from the subtraction base result, resulting in another subtraction base result and borrow result. The process is repeated until the borrow result logic is all logic 0. An example of subtraction is shown in FIG. 5, where word B 011110 (in register 538) is to be subtracted from word A 110101 (in register 537). Subtraction results have a base subtraction result of 101011 stored in register 539, and a borrow result of 001010 stored in borrow register 541, with an extra 0 added to replace the shifted 0 from register entry 545. The borrow result in register 541 is shifted to the left as shown at 543, resulting in 010100, and the shifted borrow result is subtracted from the base subtraction result stored in register 539. This results in a base subtraction result of 111111 and a borrow result of 010100 (547). The borrow result is shifted, resulting in 101000, which subtracted from 111111 (549) results in 010111 as a base subtraction result with a 000000 borrow result stored in register 551. Subtraction is complete, that is, 110101−011110=10111. Again, this complex function can be performed with the basic logic operation present in sense circuitry 150, page buffer 170, and a left/right shift operation.

Further complex arithmetic functions can be performed using the basic principles outlined above. For example, multiplication can be performed as a series of additions. Further, using multiple registers and the ability described herein for shifting contents of a register, multiplication and division may also be performed. For example, in a multiplication, a basic multiply function may be broken into multiple blocks, which may be shifted and added as in standard long form multiplication. For example, as shown in FIG. 6, to multiply word A 10111 (637) by word B 111 (638), the following process may be used. Word A and word B area loaded into registers 637 and 638, respectively. The least significant bit (LSB) of word B (1) is multiplied by word A. The result, product 1, 10111, is stored in a third register 639. The second LSB of word B (1) is multiplied by word A. The result, product 2, 10111, is stored in a fourth register 641, and the contents of register 641 are shifted to the left to yield 101110, with an extra 0 added to replace the shifted 1 from register entry 645 (643). The results stored in registers 639 and 641 are added, not shown but as described above with respect to FIG. 4, resulting in 1000101 which in one embodiment is stored in a fifth register, or in product1 register 639 (647). The third LSB of word B (1) is multiplied by word A. the product, 10111, is stored in a register (647), and that product is shifted left by two places to yield 1011100 (649). This result is added to 1000101, in one embodiment using the method described above with respect to FIG. 4, yielding 10100001, the result of the multiplication (651). It should be understood that registers may be re-used for intermediate sum and carry operations, and that the register design is within the scope of one of ordinary skill of the art.

It should also be understood that additional arithmetic functions may be performed using sense circuitry 150, the registers, page buffer 170, and left/right shift operations, and that such functions are within the scope of the present disclosure.

Figure 7:
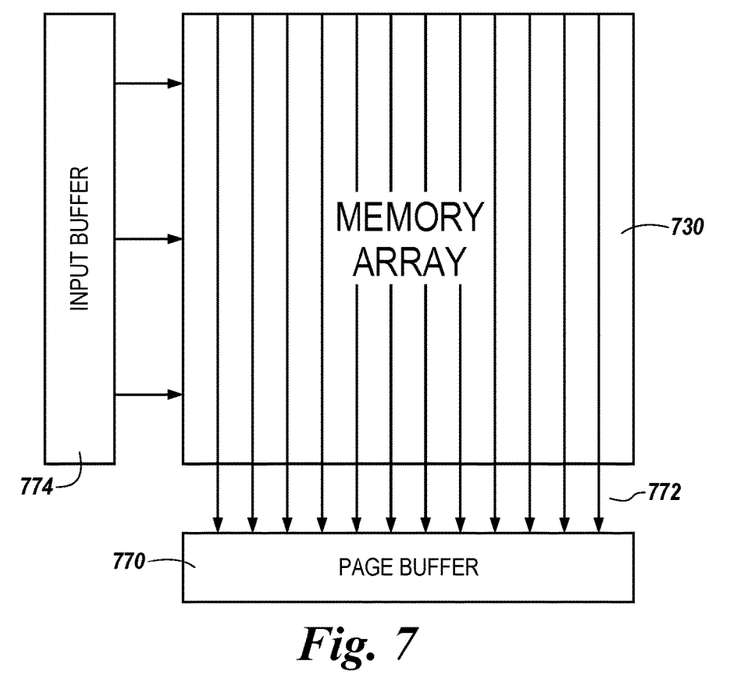
FIG. 7 is a block diagram of a portion of a memory device in accordance with a number of embodiments of the present disclosure.

The arithmetic functions and logical operations described above can be performed in a page buffer of a memory array 730, as illustrated in FIG. 7. FIG. 7 shows a page buffer 770 (e.g., page buffer 170 previously described in connection with FIG. 1) coupled to sense (e.g., bit) lines 772 of memory array 730 (e.g., memory array 130 previously described in connection with FIG. 1). An input buffer 774 is also coupled to the memory array 730. The input buffer 774 can be used to temporarily store input feature vectors for comparison to data feature vectors stored in memory array 730. The memory array 730 can comprise a plurality of series strings of memory cells, such as NAND flash memory cells, and can be part of a memory device (e.g., memory device 120 previously described in connection with FIG. 1).

Figure 8:
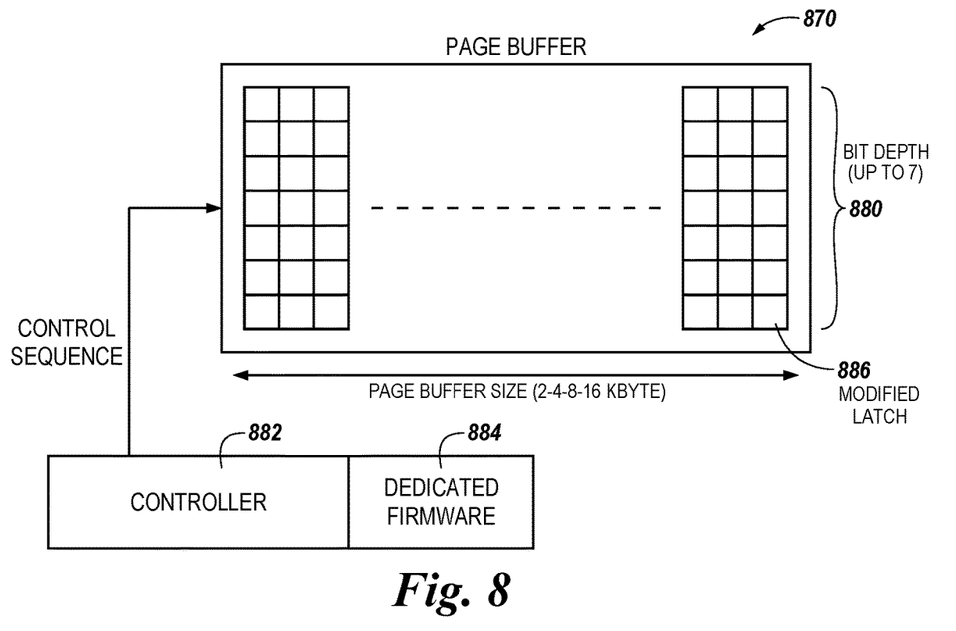
FIG. 8 is a block diagram of a page buffer and latch in accordance with a number of embodiments of the present disclosure.

FIG. 8 is a block diagram of a page buffer 870 and latch 886 in accordance with a number of embodiments of the present disclosure. For instance, page buffer 870 can be page buffer 770 previously described in connection with FIG. 7. In an embodiment, page buffer 770 can be up to seven bits of data in depth.

Control of page buffer 870 can be effected through a controller 882 having dedicated firmware 884. The firmware 884 and controller 882, in combination with the data shifting described above embodied in a modified latch 886 (e.g., a latch that allows for data shifting as described above), allow for the arithmetic functions and logic operations of the present disclosure. The controller 882 can control access to memory array 730 previously described in connection with FIG. 7, and can generate status information for an external controller (e.g., an external processing resource).

Figure 9:
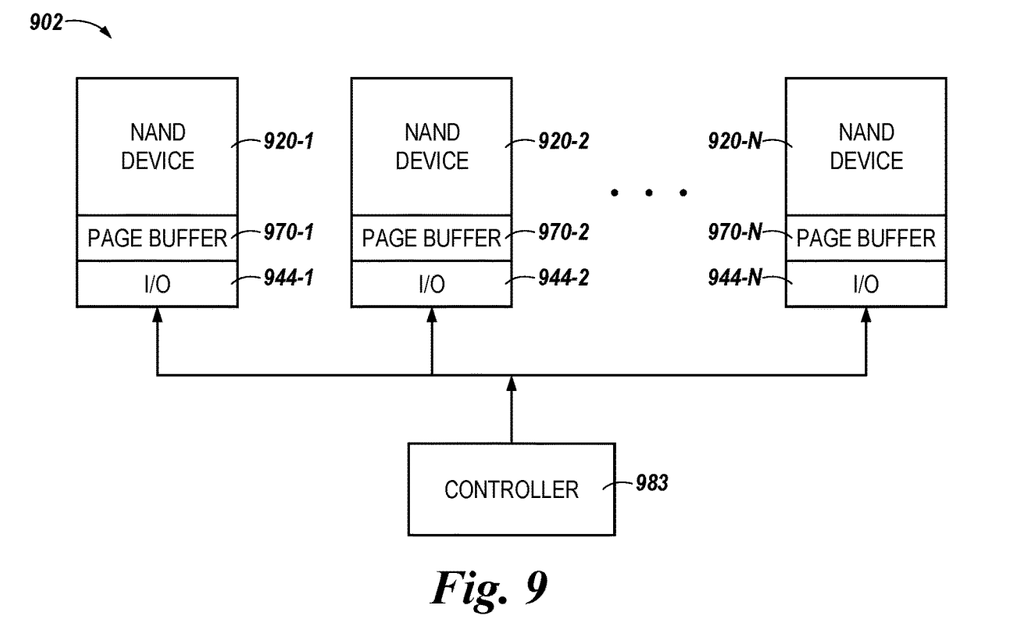
FIG. 9 is a block diagram of a portion of a memory system in accordance with a number of embodiments of the present disclosure.

FIG. 9 is a block diagram of a portion of a memory system 902 in accordance with a number of embodiments of the present disclosure. As shown in FIG. 9, memory system 902 can include a plurality of memory devices (e.g., NAND memory devices) 920-1, 920-2, . . . , 920-N, which can be analogous to memory device 120 previously described in connection with FIG. 1. For instance, each respective NAND device 920-1, 920-2, . . . , 920-N can include a number of arrays of NAND flash memory cells arranged in rows coupled by access lines (e.g., word lines) and columns coupled by sense lines (e.g., bit lines). Each respective NAND device 920 can be, for instance, a bare die, a single packaged chip, a multi-chip package including NAND, a managed NAND device, a memory card, a solid state drive, or some combination thereof.

As shown in FIG. 9, each respective memory device 920-1, 920-2, . . . , 920-N can include a page buffer 970-1, 970-2, . . . , 970-N, which can each be analogous to page buffer 170, 770, and/or 870 previously described in connection with FIGS. 1, 7, and 8, respectively. For instance, page buffers 970-1, 970-2, . . . , 970-N can perform the arithmetic functions and logical operations described above in connection with executing data queries in accordance with the present disclosure. Further, each respective memory device 920-1, 920-2, . . . , 920-N can include I/O circuitry 944-1, 944-2, . . . , 944-N, as illustrated in FIG. 9, which can be analogous to I/O circuitry 144 previously described in connection with FIG. 1.

Each respective page buffer 970 can be formed on the same chip as the array(s) of its respective NAND device 920. For instance, page buffer 970-1 can be formed on the same chip as the array(s) of NAND device 920-1, page buffer 970-2 can be formed on the same chip as the array(s) of NAND device 920-2, etc. Further, although a single page buffer 970 is shown for each respective NAND device 920 in FIG. 9 for simplicity and so as not to obscure embodiments of the present disclosure, each respective NAND device 920 can include a number of page buffers analogous to page buffers 970. For instance, each respective NAND device 920 can include a different respective page buffer for (e.g., formed on the same chip as) each respective memory array of the device.

As shown in FIG. 9, memory system 902 can include a controller 983. Controller 983 can be an external controller (e.g., external to NAND devices 920) that can control (e.g., device) NAND devices 920. For instance, controller 983 can be a controller on a host device, such as host 110 previously described in connection with FIG. 1.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   an array of memory cells; and
   processing circuitry configured to:
      receive, from a host, a query for particular data stored in the array;
      execute the query by:
         sensing data stored in the array;
         creating a mask for the sensed data on which an arithmetic operation is to be performed;
         creating an operand for the arithmetic operation;
         applying an operator of the arithmetic operation to the operand and the sensed data for which the mask was created; and
         nullifying the sensed data that is determined to be invalid upon applying the operator of the arithmetic operation; and
      send only the particular data to the host upon executing the query.

2. The apparatus of claim 1, wherein the processing circuitry includes a page buffer configured to apply the operator of the arithmetic operation.

3. The apparatus of claim 1, wherein the array and the processing circuitry are formed on a same chip of the apparatus.

4. The apparatus of claim 1, wherein:
   the query comprises a command to search for the particular data; and
   the processing circuitry is configured to execute the query by searching for the particular data in the array.

5. The apparatus of claim 1, wherein:
   the array includes a plurality of pages of memory cells; and
   the processing circuitry is configured to execute the query on each of the pages.

6. The apparatus of claim 1, wherein the processing circuitry is configured to:
   receive, from the host, a command to sense data stored in the array; and
   execute the command to sense the data in parallel with executing the query.

7. The apparatus of claim 1, wherein the array of memory cells comprises a database.

8. A method of operating processing circuitry, comprising:
   receiving, from a host, a query for data stored in an array of memory cells;
   performing an error correction code (ECC) operation on the data stored in the array;
   identifying the data stored in the array that matches the query by performing an arithmetic operation on the data stored in the array after performing the ECC operation on the data; and
   sending only the identified data that matches the query to the host.

9. The method of claim 8, wherein no data stored in the array that does not match the query is sent to the host.

10. The method of claim 8, wherein:
    the data stored in the array includes a number of records, wherein each respective record includes a number of fields; and
    identifying the data stored in the array that matches the query comprises identifying whether data stored in one of the number of fields in each respective record matches the query.

11. The method of claim 10, wherein the method comprises identifying whether the data stored in the one of the number of fields in each respective record matches the query in parallel.

12. An apparatus, comprising:
    an array of memory cells; and
    processing circuitry configured to:
       receive, from a host, a query for data stored in the array;
       perform an error correction code (ECC) operation on the data stored in the array;
       identify the data stored in the array that matches the query by performing an arithmetic operation on the data stored in the array after performing the ECC operation on the data; and
       send only the identified data that matches the query to the host.

13. The apparatus of claim 12, wherein performing the arithmetic operation on the data stored in the array comprises performing the arithmetic operation on multiple portions of the data in parallel.

14. The apparatus of claim 12, wherein performing the arithmetic operation on the data stored in the array comprises determining whether a quantity represented by the data stored in the array is less than a particular quantity.

15. The apparatus of claim 12, wherein performing the arithmetic operation on the data stored in the array comprises determining whether a quantity represented by the data stored in the array is greater than a particular quantity.

16. The apparatus of claim 12, wherein the processing circuitry includes a page buffer configured to perform the arithmetic operation on the data stored in the array.

17. The apparatus of claim 12, wherein the processing circuitry is configured to identify the data stored in the array that matches the query by:
  sensing the data stored in the array;
  creating a mask for the sensed data on which the arithmetic operation is to be performed;
  creating an operand for the arithmetic operation;
  applying an operator of the arithmetic operation to the operand and the sensed data for which the mask was created; and
  nullifying the sensed data that is determined to be invalid upon applying the operator of the arithmetic operation.

18. The apparatus of claim 17, wherein the processing circuitry is configured to send only the identified data that matches the query to the host by sending, to the host, the sensed data that is determined to be valid upon applying the operator of the arithmetic operation.

19. The apparatus of claim 12, wherein the processing circuitry is formed on pitch with the memory cells of the array.

20. A system, comprising:
  a host; and
  a memory device coupled the host;
  wherein:
    the host is configured to send, to the memory device, a query for particular data stored in the memory device; and
    the memory device is configured to:
      execute the query upon receiving the query from the host by:
        sensing data stored in the memory device;
        creating a mask for the sensed data on which an arithmetic operation is to be performed;
        creating an operand for the arithmetic operation;
        applying an operator of the arithmetic operation to the operand and the sensed data for which the mask was created; and
        nullifying the sensed data that is determined to be invalid upon applying the operator of the arithmetic operation; and
      send only the particular data to the host upon executing the query.

21. The system of claim 20, wherein:
  the memory device includes a number of records of data; and
  each respective record includes a number of data fields.

22. The system of claim 21, wherein the query for the particular data stored in the memory device comprises a query for data stored in a particular one of the number of data fields of each respective record.

23. The system of claim 21, wherein the host is configured to define an amount of data included in each respective data field of the number of records.

24. The system of claim 20, wherein:
  the memory device includes a plurality of memory arrays; and
  the memory device is configured to execute the query on each of the memory arrays in parallel.

* * * * *